United States Patent

Ohnishi et al.

[11] Patent Number: 6,153,460
[45] Date of Patent: Nov. 28, 2000

[54] METHOD OF FABRICATING SEMICONDUCTOR MEMORY DEVICE

[75] Inventors: Shigeo Ohnishi, Nara; Nobuyuki Takenaka, Tenri; Katsuji Iguchi, Yamatokouriyama, all of Japan

[73] Assignee: Sharp Kabushiki Kaisha, Osaka, Japan

[21] Appl. No.: 09/470,990

[22] Filed: Dec. 23, 1999

[30] Foreign Application Priority Data

Dec. 28, 1998 [JP] Japan ................... 10-373876

[51] Int. Cl.⁷ ................................ H01L 21/8234
[52] U.S. Cl. .................. 438/238; 438/691; 438/240; 438/259; 438/260; 438/754
[58] Field of Search ....................... 438/238, 640, 438/754, 701, 673, 704, 624, 244, 259, 260, 240, 697, 691; 257/306

[56] References Cited

U.S. PATENT DOCUMENTS

| | | | |
|---|---|---|---|
| 4,999,689 | 3/1991 | Iguchi et al. | 357/23.6 |
| 5,619,071 | 4/1997 | Myers et al. | 257/753 |
| 5,677,231 | 10/1997 | Maniar et al. | 437/67 |
| 5,950,084 | 9/1999 | Chao | 438/244 |
| 5,986,301 | 11/1999 | Fukushima et al. | 257/306 |
| 5,994,214 | 11/1999 | Hayashi et al. | 438/624 |
| 5,995,774 | 9/1999 | Kang | 257/533 |

FOREIGN PATENT DOCUMENTS 7-22518  1/1995  Japan .
9-148537  6/1997  Japan .

*Primary Examiner*—Matthew Smith
*Assistant Examiner*—V. Yevsikov
*Attorney, Agent, or Firm*—Nixon & Vanderhye P.C.

[57] ABSTRACT

A method of fabricating a semiconductor memory device comprises the steps of: (a) forming an interlayer insulating film on a semiconductor substrate, opening a contact hole in said interlayer insulating film, and burying a plug in said contact hole; (b) forming a first insulating film on said interlayer insulating film inclusive of said plug, and forming a trench in said first insulating film above said plug; (c) forming a first conductive film on said first insulating film inclusive of said trench, and etching back said first conductive film by a chemical mechanical polishing method to form a bottom electrode inside said trench; (d) forming a high dielectric film or a ferroelectric film and a second conductive film in this order on said first insulating film inclusive of said bottom electrode; and (e) patterning simultaneously said high dielectric film or ferroelectric film and said second conductive film to form a capacitor insulating film and a top electrode.

7 Claims, 4 Drawing Sheets

METHOD OF FABRICATING SEMICONDUCTOR MEMORY DEVICE

BACKGROUND OF THE INVENTION

1. Field of the Invention

This invention relates to a method of fabricating a semiconductor memory device. More particularly, this invention relates to a method of fabricating a semiconductor memory device which includes formation of miniature capacitors through electrode formation using a CMP method in order to achieve a high integration density in ferroelectric memories and DRAMs.

2. Description of the Related Art

FIG. 3 of the accompanying drawings illustrates a ferroelectric memory cell having one-transistor/one-capacitor (or two-transistor/two-capacitor) structure according to the prior art. A planar capacitor Cp is formed over a transistor Tr with intervention of an insulating film 30 as shown in FIG. 3. The transistor Tr and the capacitor Cp are completely isolated from each other. Therefore, after the capacitor Cp is formed on the insulating film 30, the capacitor Cp and the transistor Tr are connected by local lead wires 31.

However, the structure of the memory cell shown in FIG. 3 has a large occupying area and is not suitable for achieving high integration.

To solve this problem, a ferroelectric memory cell or a DRAM having a structure in which a contact plug 33 made of polysilicon or tungsten is formed on a source region 32 of a MOSFET and a stacked capacitor Cp is formed over the contact plug 33, has been proposed.

The stacked capacitor Cp shown in FIG. 4 is generally fabricated in the following way. A conductive film made of a material such as Ir, $IrO_2$/Ir, Pt, Ru or $RuO_2$/Ru is deposited on a semiconductor substrate including transistors, an interlayer insulating film deposited on the transistors, and contact holes each being bored in the interlayer insulating film and contact plugs each being formed inside the contact hole. The conductive film is patterned to form bottom electrode (node electrode) by dry etching. A ferroelectric film (such as PZT or SBT) or a high dielectric film (such as BST) is deposited, and a conductive film as a top electrode, made of a material such as Ir, $IrO_2$, Pt, Ru or $RuO_2$ is deposited. The conductive film and the ferroelectric film (or the high dielectric film) are patterned to form a common plate (or a drive line) by dry etching.

However, the conductive film of Pt, Ir, $IrO_2$, or the like, used for the top electrode or the bottom electrode, has generally low reactivity with a halogenated gas used for dry etching, and volatility of reaction products is low, too. Therefore, its etching rate is low and fine patterning is difficult to perform. Furthermore, in the case of patterns of the order of sub-micron or finer, a micro-loading effect is serious and there arise the problems of adhesion of the reaction products to the conductive film and the development of particles.

In order to achieve a high integration density of the memories of this kind, it is essentially necessary to establish a fine etching technique for inactive metals such as Pt and Ir.

Therefore, Japanese Patent Laid-Open Nos. HEI 9(1997)148537 and HEI 7(1995)22518 propose etching-back by a chemical mechanical polishing (CMP) method using a slurry containing a strong acid or alkali electrolyte.

According to Japanese Patent Laid-Open No. HEI 9(1997)148537, for example, a $SiO_2$ film 42 is formed on a contact plug 41 in a semiconductor substrate that includes transistors, an interlayer insulating film 40 deposited on the transistors, contact holes formed in the interlayer insulating film 40 and contact plugs formed inside the contact holes, as shown in FIG. 5. Then an opening is formed in this $SiO_2$ film above the contact plug 41 using a mask, a bottom electrode 43, a ferroelectric member 44, a top electrode 45 and a TEOS film 46 are serially deposited into this opening. These films are then polished simultaneously by a CMP method. In consequence, an isolated capacitor Cp having a recess shape is fabricated inside the opening formed in the $SiO_2$ film and at the same time the TEOS film 46 is buried in the recess of the surface of this isolated capacitor Cp. A contact hole is opened in the TEOS film 46 at the recess of the isolated capacitor Cp by dry etching using a mask. A metal film is formed on the capacitor inclusive of this contact hole, and patterning is conducted using this metal film as a mask in order to form a common plate electrode 47.

However, such a process requires three masks, that is, the mask for forming the opening in the $SiO_2$ film on the contact plug 41, the mask for opening the contact hole in the TEOS film 46 and the mask for patterning to form the common plate electrode 47. In addition, such a process requires the CMP method for forming the capacitor inside the opening of the $SiO_2$ film 42 and a dry etching step for forming the contact hole in the TEOS film 46. Furthermore, the contact hole must be formed above the resulting capacitor. After all, this process involves the problem that the formation of the contact hole itself will be difficult when further miniaturization is required.

According to Japanese Patent Laid-Open No. HEI 7(1995)22518, a $SiO_2$ film 52 is formed on a contact plug 51 in a semiconductor substrate that has transistors, an interlayer insulating film 50, contact holes formed in the interlayer insulating film 50 and the contact plugs 51 formed inside the contact holes, as shown in FIG. 6. An opening is then formed in the $SiO_2$ film 52 above the contact plug 51 using a mask, and a conductive film is deposited on the opening. The conductive film is polished by CMP method to form an isolated storage electrode 53, that is connected to the contact plug 51. Next, a ferroelectric film 54 and a $SiO_2$ film 55 are serially deposited on the storage electrode 53. A trench corresponding to a drive line is formed in the $SiO_2$ film 55 above the storage electrode 53 using a mask, and a conductive film is deposited. Subsequently, the conductive film is polished by a CMP method so as to form an isolated drive line 56.

However, this process involves the problem that when the ferroelectric film is patterned, the ferroelectric film on a circuit portion around a memory array is damaged by plasma caused by dry etching. As a result ferroelectric characteristics deteriorate.

SUMMARY OF THE INVENTION

The present invention provides a method of fabricating a semiconductor memory device comprising the steps of: (a) forming an interlayer insulating film on a semiconductor substrate, opening a contact hole in said interlayer insulating film, and burying a plug in said contact hole; (b) forming a first insulating film on said interlayer insulating film inclusive of said plug, and forming a trench in said first insulating film above said plug; (c) forming a first conductive film on said first insulating film inclusive of said trench, and etching back said first conductive film by a chemical mechanical polishing method to form a bottom electrode inside said trench; (d) forming a high dielectric film or a ferroelectric film and a second conductive film in this order on said first insulating film inclusive of said bottom electrode; and (e) patterning simultaneously said high dielectric film or ferroelectric film and said second conductive film to form a capacitor insulating film and a top electrode.

Further, the present invention provide a method of fabricating a semiconductor memory device comprising the steps of: (A) forming an interlayer insulating film on a semiconductor substrate, opening a contact hole in said interlayer insulating film and burying a plug inside said contact hole; (B) forming a first insulating film on said interlayer insulating film inclusive of said plug, and forming a trench in said first insulating film above said plug; (C) forming a first conductive film on said first insulating film inclusive of said trench, and etching back said first conductive film by a chemical mechanical polishing method to form a bottom electrode inside said trench; (D) forming a second insulating film on said first insulating film inclusive of said bottom electrode, and forming a trench in said second insulating film on said bottom electrode; (E) forming a side wall spacer of an insulating film on a side wall of said trench; (F) forming a high dielectric film or a ferroelectric film and a second conductive film in this order on said second insulating film inclusive of said trench and said side wall spacer; and (G) etching back simultaneously said high dielectric film or ferroelectric film and said second conductive film by a chemical mechanical polishing method to form a capacitor insulating film and a top electrode.

DESCRIPTION OF THE PREFERRED EMBODIMENTS

Figure 1A:
FIGS. 1(a) to 1(e) are schematic sectional views showing step-wise a method of fabricating a semiconductor device according to one embodiment of the present invention.

The method of fabricating a semiconductor device according to the present invention includes (a) a first step of forming an interlayer insulating film on a semiconductor substrate, opening a contact hole in the interlayer insulating film and then burying a plug inside contact hole.

The semiconductor substrate that can be employed in the present invention is not particularly limited. Those substrates which are generally used for fabricating semiconductor devices can be used. For example, substrates made of semiconductors such as silicon and germanium, and compound semiconductors such as GaAs and InGaAs can be used. Preferred among them is the silicon substrate. A device isolation film may be formed on this semiconductor substrate by a LOCOS process or a trench device isolation process. Furthermore, devices such as transistors, capacitors or resistors, lead wires, insulating films, and so forth, may be formed either individually or in combination.

The interlayer insulating film is formed on the semiconductor substrate. The material for this interlayer insulating film is not particularly limited so long as it is an insulating film. Typical examples include insulating films such as a silicon oxide film, a silicon nitride film, a PSG film and a BPSG film. These films may be either a single-layered film or a multi-layered film. The insulating film can be fabricated by a known process such as CVD method. The film thickness of the interlayer insulating film may be generally such that it can function as the interlayer insulating film, for example, from about 700 to about 3,000 nm.

The contact hole is then formed in this interlayer insulating film. The method of forming the contact hole is not limited, in particular. For example, the contact hole can be formed by photolithography and etching process. The size of the contact hole is not particularly limited, either, so long as the contact holes can secure electric connection between an upper and a lower layers sandwiching the interlayer insulating film.

The plug is formed inside the contact hole. Preferably, the plug is formed of a conductive material to have a flat and smooth surface. Examples of the conductive material include high melting metals such as titanium, tantalum and tungsten, and polysilicon. These materials may be formed in a single-layered film or a malti-layered film. A barrier metal made of TiN, TaSiN or the like, may be formed at a lower or upper layer of the plug in order to secure adhesion with other conductive materials. These plug and barrier metal can be formed by known methods such as sputtering and vacuum deposition in combination with etching-back, preferably etching-back by a CMP method.

Next, (b) a first insulating film is formed on the interlayer insulating film inclusive of the plug, and a trench is formed in the first insulating film on the plug.

Generally, the first insulating film is formed preferably on the entire surface of the interlayer insulating film inclusive of the plug. The material of the first insulating film is not particularly limited so long as it gives a film having an insulating property. Examples include single-layered or multi-layered films of silicon oxide, silicon nitride, $TiO_2$, $TaO_2$, and so forth. Incidentally, it is preferred to use a laminate film of $TiO_2/SiO_2$ in order to improve adhesion with a bottom electrode that is to be formed on the plug and will be explained elsewhere. These insulating films can be formed by a known method such as a CVD method. The film thickness of the first insulating film is from about 2,000 to about 3,000 nm, for example.

The trench is then formed in the first insulating film. The trench is preferably formed in such a fashion that the trench is situated over the plug with the bottom thereof reaching the plug, covers the plug as a whole and expands up to and over the outer peripheral portion of the plug. The size of the trench determines substantially the size of the bottom electrode that is to be formed by a later-appearing step. The trench can be formed by a known method such as photolithography and etching process. Incidentally, after the trench is formed in the first insulating film, a side wall spacer may be formed by another insulating material as described above on the side wall of the first insulating film.

Next, (c) a first conductive film is formed on the first insulating film inclusive of the trench, and is then etched back by a CMP method to form the bottom electrode.

Generally, the first conductive film is preferably formed on the entire surface of the first insulating film inclusive of the trench. The material for the first conductive film is not limited, in particular, so long as it is an ordinary electrode material. Particularly preferred is a single-layered film or multi-layered film of Pt, Ru, Ir, $IrO_2/Ru$ or $IrO_2/Ir$. The film thickness of this first conductive film is preferably greater than the depth of the trench formed previously. The film thickness is, for example, from about 500 to about 2,000 angstroms. The first conductive film can be formed by a known method such as a CVD or MOCVD method, sputtering, plating or electroplating. Among them, the MOCVD method and electroplating are preferred from the aspect of coverage performance. More precisely, in the case of the MOCVD method, an organic metal complex of Pt or Ir having a relatively high vapor pressure as a starting material is thermally decomposed. In the case of electroplating, an electrolyte of $H_2[PtCl_4]$, $H_2[Pt(NO_2)]$, $H_2[Pt(CN)_4]$, $Ir_2(SO_4)_3$, $M \cdot Ir(SO_4)_2 \cdot 12H_2O$ or the like is electrolyzed. Incidentally, because electroplating needs a seed layer constituted of the same metal, a film of the same metal as the first conductive film to be made is formed in advance as the seed layer by sputtering, an ion metal plasma process or the like.

The first conductive film is etched back by a CMP method to give the bottom electrode only inside the trench. In other words, the first conductive film that exists on the first insulating film other than inside the trench is removed by etching. Here, the CMP method is a polishing method that is carried out by preparing first a slurry by mixing a solution capable of dissolving the metal constituting the first conductive film, with a polishing agent such as $CeO_2$, $ZrO_2$ or $Al_2O_3$, and applying the slurry to a to-be-etched object on a rotary plate at a feed ratio of 150 to 200 sccm. The solution for dissolving the metal constituting the first conductive film is aqua regia for Pt and a solution of sodium hydroxide or potassium/$KNO_3$ for Ir. If the film thickness of the first conductive film is smaller than the depth of the trench, the bottom electrode can be shaped into a recess shape only inside the trench. If the film thickness of the first conductor is substantially equal to or greater than the depth of the trench, the bottom electrode can be formed inside the trench with its surface being flat and keeping the same level as the surface of the first insulating film.

Furthermore, (d) a high dielectric film or a ferroelectric film and a second conductive film are formed in this order on the first insulating film inclusive of the bottom electrode. The high dielectric film or the ferroelectric film and the second conductive film are preferably formed on the entire surface of the first insulating film inclusive of the lower electrode. Here, the high dielectric film or the ferroelectric film functions as a capacitor insulating film. For example, the high dielectric film is formed of $(Ba, sr)TiO_3$ and the ferroelectric film is formed of $PbTi_xZr_{1-x}O_3$ (0<x<1) or $SrBi_2Ta_2O_9$. The film thickness of these films is from about 500 to about 2,000 angstroms. These films can be formed by a known method such as a MOCVD method, sputtering, a MOD method or a sol-gel method. After these films are formed, an annealing treatment is preferably carried out in an atmosphere of oxygen, oxygen/nitrogen oxygen/argon or the like, at a temperature within the range of about 400 to about 800° C. for 30 seconds to several hours.

The second conductive film may be made of the same material in the same thickness by the same method as the first conductive film. Incidentally, the first and second conductive films need not always be made of the same material and shaped into the same film thickness, but can be adjusted appropriately depending on characteristics of the semiconductor devices and elements and an insulating film disposed on their lower or upper layer.

Subsequently, (e) the high dielectric film or the ferroelectric film and the second conductive film are patterned simultaneously to form a capacitor insulating film and a top electrode.

The high dielectric film or the ferroelectric film and the second conductive film may be patterned into the same size as or a greater size than the trench. In this way, the capacitor comprising the bottom electrode disposed only inside the trench, the capacitor insulating film and the top electrode can be formed.

The bottom electrode and the top electrode can be formed to function as a node electrode, and as a common plate electrode or a drive line, respectively.

Another method of fabricating a semiconductor device of the present invention forms a bottom electrode in its process steps (A) to (C) in the same way as the steps (a) to (c) described above. In this case, the bottom electrode is preferably so formed that it exists inside a trench and its surface has the same level as a first insulating film and has a smooth and flat surface.

Next, (D) a second insulating film is formed on the first insulating film inclusive of the bottom electrode, and a trench is formed in the second insulating film on the bottom electrode.

The second insulating film can be formed using the same material in the same way as the first insulating film. Since the film thickness of this second insulating film determines the film thickness of a top electrode to be formed in a subsequent step, the second insulating film is preferably shaped in a film thickness corresponding to the film thickness of the top electrode. For example, it is from about 2,000 to about 5,000 angstroms.

The trench is then formed in the second insulating film on the lower electrode. This trench can be formed by the same method as the trench is formed in the first insulating film in the process step (b). The size of the trench is not particularly limited, but the trench is preferably in such a size as to cover the bottom electrode and to expand beyond the outer peripheral portion of the bottom electrode.

Furthermore, (E) a side wall spacer of an insulating film is formed on a side wall of the trench. In this case, the insulating film side wall spacer may be formed by forming a film of the same material as that of the first insulating film, preferably $TiO_2$ or $TaO_2$, in a film thickness of about 200 to about 1,000 angstroms and etching back the film using RIE. The insulating film side wall spacer can prevent deterioration of a silicon oxide film and a high dielectric film or a ferroelectric film to be formed in a later-appearing step due to their mutual contact.

Next, (F) a high dielectric film or a ferroelectric film and the second conductive film are formed in this order on the second insulating film inclusive of the trench and the insulating film side wall spacer. Generally, the high dielectric film or the ferroelectric film and the second conductive film are preferably formed on the entire surface of the second insulating film. Incidentally, these films can be formed of the same materials by the same methods as those of the step (d) described above.

Subsequently, (G) the high dielectric film or the ferroelectric film and the second conductive film are simultaneously etched back by a CMP method to provide a capacitor insulating film and a top electrode. Etching-back in this case can be carried out in the same way as in the process step (c). In this way, the top electrode can be formed inside the trench so that its surface has the same level as the second insulating film and has a flat and smooth surface.

Hereinafter, methods of fabricating a semiconductor device according to preferred embodiments of the present invention will be explained with reference to the accompanying drawings. However, the present invention is in no way limited to these embodiments.

EMBODIMENT 1

Initially, an interlayer insulating film comprising a $SiO_2$ film 2 having a thickness of about 1 to 1.5 μm and a SiN film 3 having a film thickness of about 500 angstroms is formed on a silicon substrate 1 on which transistors are fabricated, as shown in FIG. 1(a). Contact holes are formed in this interlayer insulating film, and a doped polysilicon film having a thickness of about 1,000 to about 3,000 angstroms is deposited. This doped polysilicon film is etched back by RIE and is buried into each contact hole to form a plug 4. Next, a TiN film, a TaSi film, etc, are deposited on this plug 4, and are etched back by CMP method to form a barrier metal 5 having a flat surface.

Figure 1B:
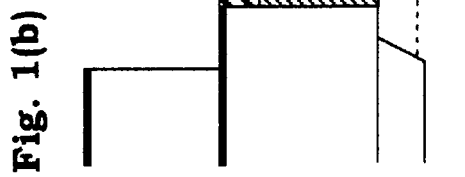

As shown in FIG. 1(b), a first insulating film comprising an $SiO_2$ film 6 having a film thickness of about 2,000 to about 3,000 angstroms and a $TiO_2$ film 7 having a film thickness of about 200 to about 1,000 angstroms is deposited. An opening is then formed, over each plug 4, at each position corresponding to a storage electrode of a capacitor. Incidentally, when the first insulating film has a two-layered structure of a $TiO_2/SiO_2$ film, adhesion can be secured between the first insulating film and a ferroelectric film when the ferroelectric film is deposited in a subsequent process step.

Figure 1C:
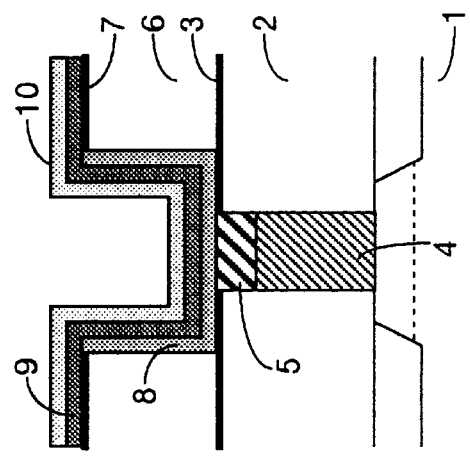

As shown in FIG. 1(c), a Pt film 8a having a film thickness of about 500 to about 2,000 angstroms is formed on the first insulating film inclusive of the openings. Here, the Pt film 8a is formed by thermally decomposing an organic metal complex of Pt having a relatively high vapor pressure.

Figure 1D:
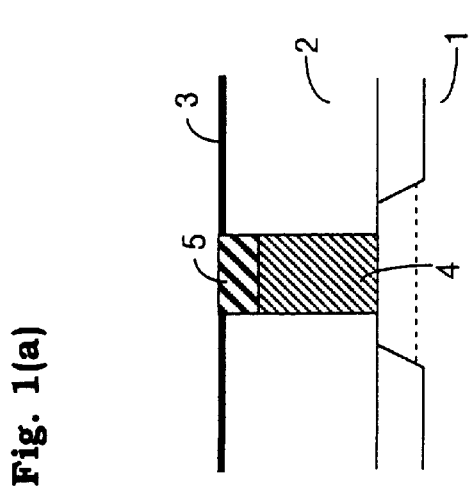

Subsequently, the Pt film 8a existing outside the opening is polished by CMP method as shown in FIG. 1(d), and a node electrode 8 serving as a recessed bottom electrode is formed only inside each opening. Here, the CMP method means a chemical mechanical polishing method that uses a slurry prepared by mixing a polishing agent such as $CeO_2$, $ZrO_2$ or $Al_2O_3$ with a solution dissolving therein Pt, such as aqua regia.

Figure 1E:
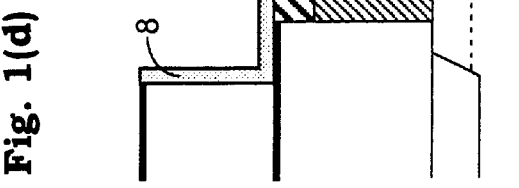

Next, a PZT film 9 is formed as a ferroelectric film to a film thickness of 500 to 2,000 angstroms on the node electrode 8 by MOCVD method, for example, as shown in FIG. 1(e). Annealing is then carried out at a temperature of about 700° C. for about 10 minutes. An Ir film 10 having a film thickness of 500 to 2,000 angstroms is formed by MOCVD method, for example. A capacitor insulating film is formed in a width greater than the opening in which the node electrode 8 is formed. At the same time, a drive line is formed, or a plate electrode is formed outside a memory cell array.

According to this method, it is not necessary to form the contact hole on the plate electrode to serve as the top electrode of the capacitor and to further form the drive line. Therefore, the fabrication steps can be simplified.

EMBODIMENT 2

Figure 2A:
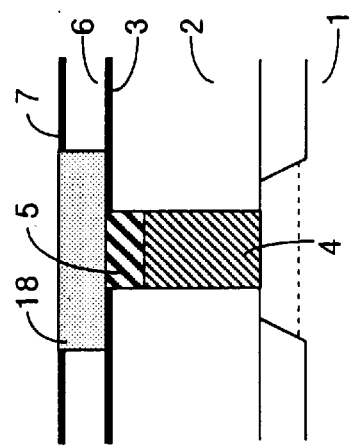
FIGS. 2(a) to 2(f) are schematic sectional views showing step-wise a method of fabricating a semiconductor device according to another embodiment of the present invention.

Initially, an interlayer insulating film, contact holes, plugs 4 and barrier metals 5 are formed on a silicon substrate 1 in the same way as in Embodiment 1 as shown in FIG. 2(a).

Figure 2B:
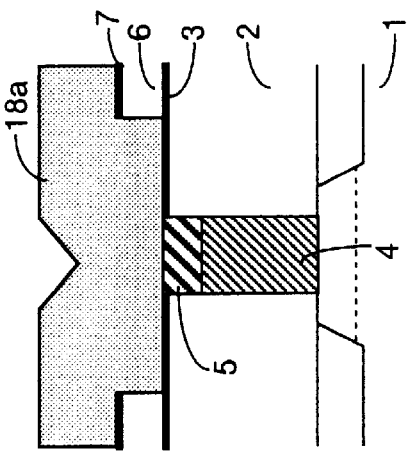

Next, as shown in FIG. 2(b), a first insulating film comprising an interlayer $SiO_2$ film 6 having a film thickness of about 1,000 to about 3,000 angstroms and an interlayer $TiO_2$ film 7 having a film thickness of about 200 to about 1,000 angstroms is deposited. Each opening is formed at a portion, above the plug 4, that corresponds to each storage electrode of a capacitor. A Pt film 18a having a film thickness of about 500 to about 2,000 angstroms is formed on the first insulating film inclusive of the openings. Here, the Pt film 18a is formed by MOCVD method that thermally decomposes an organic metal complex of Pt having a relatively low vapor pressure.

Figure 2C:
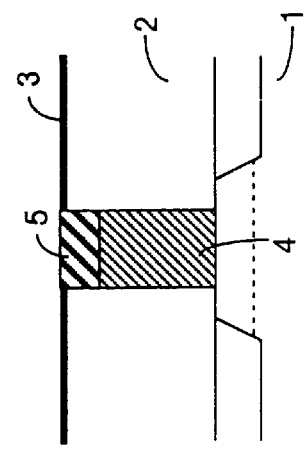

Subsequently, the Pt film 18a existing outside the openings is polished by CMP method as shown in FIG. 2(c), and a node electrode 18 as a bottom electrode to be buried into each opening is formed.

Figure 2D:
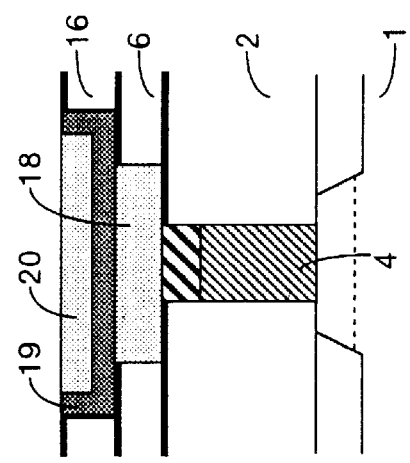

Next, as shown in FIG. 2(d), a second insulating film comprising a $SiO_2$ film 16 is formed on the $TiO_2$ film 7 inclusive of the node electrode 18, and each opening is formed at a position, over the node electrode 18, that corresponds to the drive line of the capacitor. An about 200 to about 1,000 Å-thick $TiO_2$ film is deposited onto this opening and is etched back in order to form a side wall spacer of the $TiO_2$ film 17 on the side wall of the $SiO_2$ film 16.

Figure 2E:
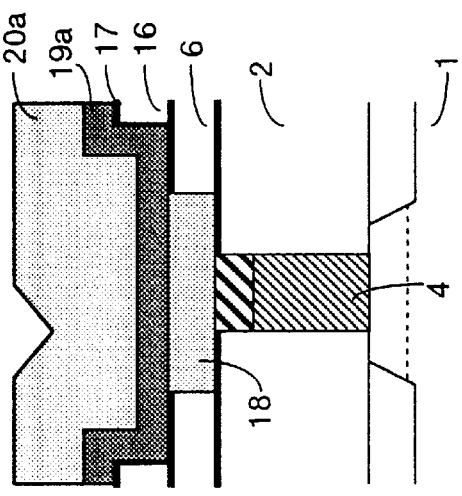

Furthermore, as shown in FIG. 2(e), a PZT film 19a as a ferroelectric film is formed to a film thickness of 500 to 2,000 angstroms by MOCVD method on the $TiO_2$ film 17 inclusive of the openings. Annealing is carried out at a temperature of about 700° C. for about 10 minutes. For example, an Ir film 20a having a film thickness of about 500 to about 2,000 angstroms is formed by MOCVD method.

Figure 2F:
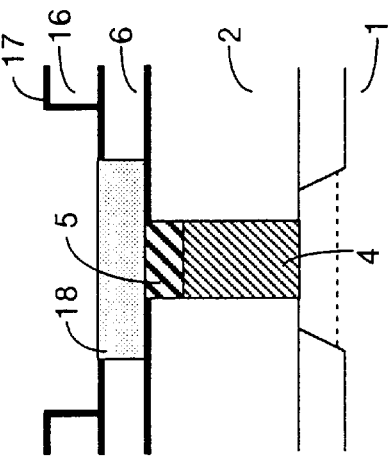
Figure 3:
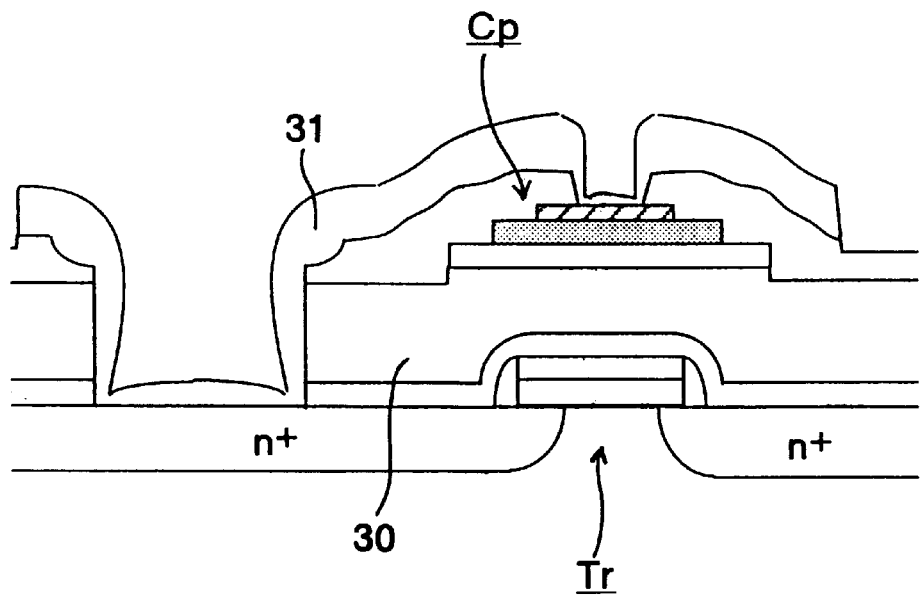
FIG. 3 is a schematic sectional view showing principal portions of a ferroelectric memory cell structure having a planar capacitor according to the prior art.
Figure 4:
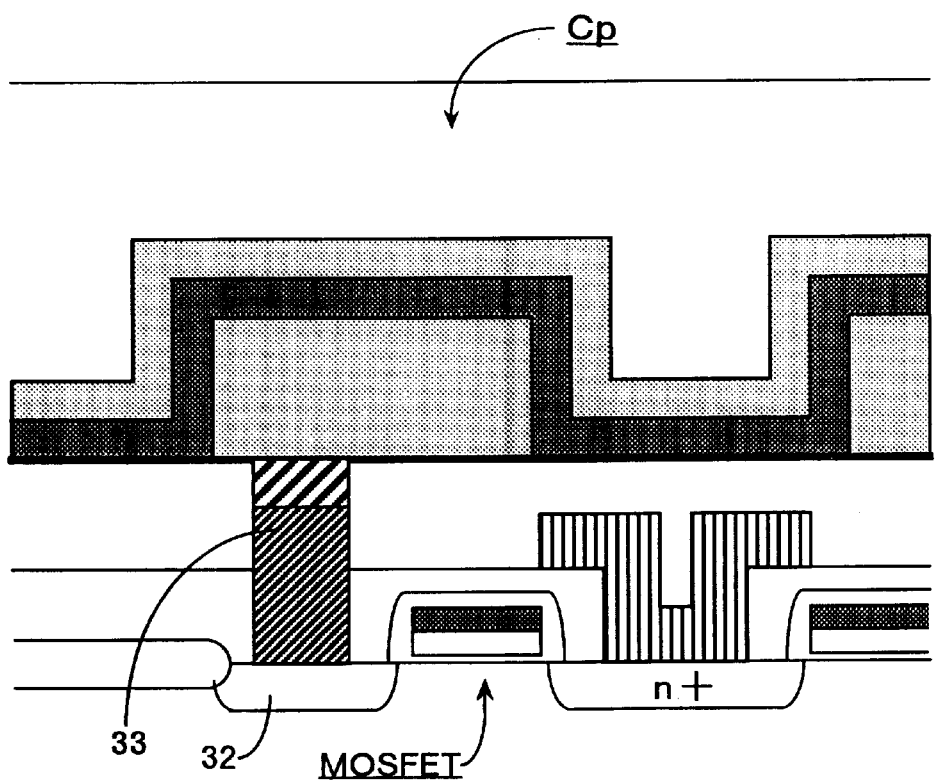
FIG. 4 is a schematic sectional view showing principal portions of a ferroelectric memory cell structure having a stacked capacitor according to the prior art.
Figure 5:
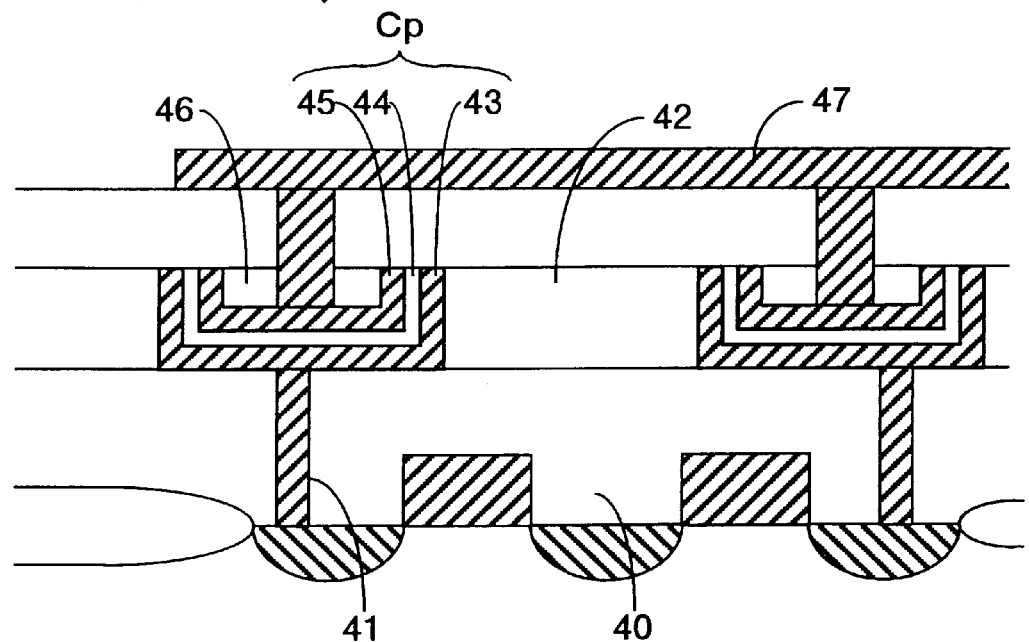
FIG. 5 is a schematic sectional view of principal portions and useful for explaining a fabrication process of a ferroelectric memory cell according to the prior art.
Figure 6:
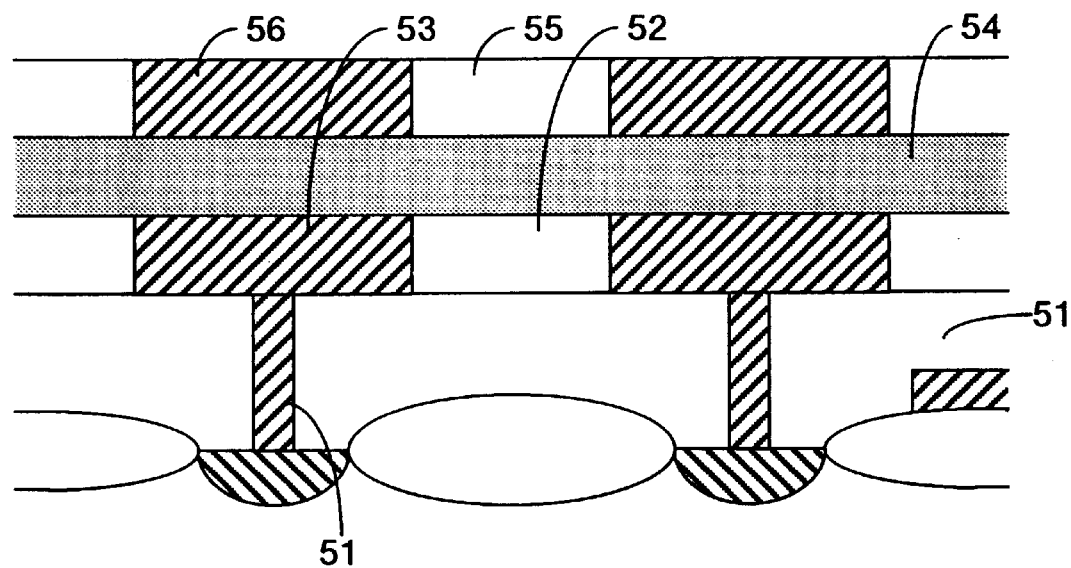
FIG. 6 is a schematic sectional view of principal portions and useful for explaining a fabrication process of a ferroelectric memory cell according to another prior art.

As shown in FIG. 2(f) the PZT film 19a and the Ir film 20a that exist outside the openings are polished by CMP method in the same way as described above. The ferroelectric film 19 and the drive line 20, each being of the type that buries the opening, are thus formed.

According to this method, only two masks are necessary; that is, the mask for forming the openings in the first insulating film on the contact plugs 4 and the mask for forming the openings in the second insulating film on the node electrode 18. Therefore, the fabrication process can be simplified. Moreover, because dry etching is not conducted, the plasma damage to the ferroelectric film can be lowered.

In the capacitor formation step in the DRAM having the one transistor/one-capacitor structure or in the ferroelectric memory device, the present invention forms the bottom electrode or all of the bottom electrode, the capacitor insulating film and the top electrode, and patterns them by CMP method. Therefore, the present invention can form the very fine capacitor capable of coping with high integration without inviting complication of the fabrication process and without imparting etching damage to the ferroelectric member, and can thus fabricate a semiconductor device capable of coping with high integration and scale-down of semiconductor devices.

What is claimed is:

1. A method of fabricating a semiconductor memory device comprising the steps of:

(a) forming an interlayer insulating film on a semiconductor substrate, opening a contact hole in said interlayer insulating film, and burying a plug in said contact hole;

(b) forming a first insulating film on said interlayer insulating film inclusive of said plug, and forming a trench in said first insulating film above said plug;

(c) forming a first conductive film on said first insulating film inclusive of said trench, and, immediately after forming said first conductive film, etching back said first conductive film by a chemical mechanical polishing method to form a bottom electrode inside said trench;

(d) forming a high dielectric film or a ferroelectric film and a second conductive film in this order on said first insulating film inclusive of said bottom electrode; and (e) patterning simultaneously said high dielectric film or ferroelectric film and said second conductive film to form a capacitor insulating film and a top electrode.

2. A method of fabricating a semiconductor memory device according to claim 1, wherein each of said bottom electrode and said top electrode is made of Pt, Ru, Ir, IrO$_2$/Ru or IrO$_2$/Ir.

3. A method of fabricating a semiconductor memory device according to claim 1, wherein said high dielectric film is made of (Ba, Sr)TiO$_3$ and said ferroelectric film is made of PbTi$_x$Zr$_{1-x}$O$_3$ or SrBi$_2$Ta$_2$O$_9$.

4. A method of fabricating a semiconductor memory device comprising the steps of:

(A) forming an interlayer insulating film on a semiconductor substrate, opening a contact hole in said interlayer insulating film and burying a plug inside said contact hole;

(B) forming a first insulating film on said interlayer insulating film inclusive of said plug, and forming a trench in said first insulating film above said plug;

(C) forming a first conductive film on said first insulating film inclusive of said trench, and etching back said first conductive film by a chemical mechanical polishing method to form a bottom electrode inside said trench;

(D) forming a second insulating film on said first insulating film inclusive of said bottom electrode, and forming a trench in said second insulating film above said bottom electrode;

(E) forming a side wall spacer of an insulating film on a side wall of said trench;

(F) forming a high dielectric film or a ferroelectric film and a second conductive film in this order on said second insulating film inclusive of said trench and said side wall spacer; and (G) etching back simultaneously said high dielectric film or ferroelectric film and second conductive film by a chemical mechanical polishing method to form a capacitor insulating film and a top electrode.

5. A method of fabricating a semiconductor memory device according to claim 2, wherein said side wall spacer is made of TiO$_2$ or TaO$_2$.

6. A method of fabricating a semiconductor memory device according to claim 4, wherein each of said bottom electrode and said top electrode is made of Pt, Ru, Ir, IRO$_2$/Ru or IRO$_2$/Ir.

7. A method of fabricating a semiconductor memory device according to claim 4, wherein said high dielectric film is made of (Ba, Sr)TiO$_3$ and said ferroelectric film is made of PbTi$_x$Zr$_{1-x}$O$_3$ or SrBi$_2$Ta$_2$O$_9$.

* * * * *